US008828793B2

(12) United States Patent
Cho et al.

(10) Patent No.: US 8,828,793 B2
(45) Date of Patent: Sep. 9, 2014

(54) METHOD OF MANUFACTURING MULTILAYERED THIN FILM THROUGH PHASE SEPARATION OF BLEND OF ORGANIC SEMICONDUCTOR/INSULATING POLYMER AND ORGANIC THIN FILM TRANSISTOR USING THE SAME

(75) Inventors: Kil Won Cho, Gyungbuk (KR); Wi Hyoung Lee, Gyungbuk (KR)

(73) Assignee: Postech Academy-Industry Foundation, Gyungbuk (KR)

( * ) Notice: Subject to any disclaimer, the term of this patent is extended or adjusted under 35 U.S.C. 154(b) by 381 days.

(21) Appl. No.: 13/140,740

(22) PCT Filed: Apr. 16, 2009

(86) PCT No.: PCT/KR2009/001964
§ 371 (c)(1),
(2), (4) Date: Oct. 13, 2011

(87) PCT Pub. No.: WO2010/071268
PCT Pub. Date: Jun. 24, 2010

(65) Prior Publication Data
US 2012/0037891 A1 Feb. 16, 2012

(30) Foreign Application Priority Data

Dec. 18, 2008 (KR) .................. 10-2008-0129296

(51) Int. Cl.
*H01L 51/40* (2006.01)
*H01L 51/00* (2006.01)
*H01L 51/05* (2006.01)

(52) U.S. Cl.
CPC ........ *H01L 51/0558* (2013.01); *H01L 51/0028* (2013.01); *H01L 51/052* (2013.01)
USPC .............................................. 438/99; 257/40

(58) Field of Classification Search
USPC ............... 257/40, E51.025, E51.005, E21.09; 438/99, 156, 483, 478, 758, 780, 781
See application file for complete search history.

(56) References Cited

U.S. PATENT DOCUMENTS

| 7,351,606 B2 | 4/2008 | Arias |
|---|---|---|
| 2005/0221530 A1 | 10/2005 | Cheng et al. |
| 2006/0043361 A1* | 3/2006 | Lee et al. ................. 257/40 |
| 2006/0163563 A1* | 7/2006 | Ulmer et al. .............. 257/40 |
| 2009/0101893 A1* | 4/2009 | Halls et al. ............... 257/40 |

FOREIGN PATENT DOCUMENTS

| JP | 2005-322870 | 11/2005 |
|---|---|---|
| JP | 2006-013492 | 1/2006 |

OTHER PUBLICATIONS

PCT/KR2009/001964 (published Jun. 24, 2010).
International Search Report, dated Jan. 14, 2010.
Kanemoto et al., Effect of the Dilution in Polyproylene on Photophysical Properties of Poly(3-alkylthiophenes), *Synthetic Metals*, Oct. 13, 2005, vol. 155; pp. 162-167.
Arias, "Vertically Separated Polymer Blends: Their Use in Organic Electronics," *Journal of Macromolecular Science, Part C: Polymer Reviews*, Jan. 2006, vol. 46, Iss. 1; pp. 103-125.
Lee et al., "Room-Temperature Self-Organizing Characteristics of Soluble Acene Field-Effect Transistors," *Advanced Functional Materials*, Feb. 22, 2008, vol. 18, Iss. 4; pp. 560-565.

* cited by examiner

*Primary Examiner* — Julio J Maldonado
*Assistant Examiner* — Robert Bachner
(74) *Attorney, Agent, or Firm* — Thompson Hine LLP

(57) ABSTRACT

Disclosed is a method of manufacturing a multilayered thin film including a crystalline small molecular organic semiconductor layer and an insulating polymer layer for use in an organic thin film transistor through phase separation and annealing. The method includes applying a blend solution of organic semiconductor and insulating polymer on a substrate thus forming a vertically phase-separated thin film, which is then annealed so that the organic semiconductor contained in the insulating polymer layer is crystallized while being transferred to the surface layer. A high-performance organic thin film transistor fabricated using the same is also provided. The multilayered thin film in which the crystalline organic semiconductor layer is located on the insulating polymer layer through transfer and crystallization of the organic semiconductor can be used to fabricate the high-performance organic thin film transistor.

20 Claims, 5 Drawing Sheets

METHOD OF MANUFACTURING MULTILAYERED THIN FILM THROUGH PHASE SEPARATION OF BLEND OF ORGANIC SEMICONDUCTOR/INSULATING POLYMER AND ORGANIC THIN FILM TRANSISTOR USING THE SAME

TECHNICAL FIELD

The present invention relates to a method of manufacturing a multilayered thin film for use in fabrication of an organic thin film transistor (OTFT), and, more particularly, to a method of simultaneously manufacturing a crystalline small molecular organic semiconductor layer and a dielectric layer from a thin film of a blend of organic semiconductor/insulating polymer through phase separation and annealing, and to a method of manufacturing an OTFT using the same.

BACKGROUND ART

Generally, an OTFT, which is a device for driving a next-generation display apparatus, is under active study. The OTFT includes, as a semiconductor layer, an organic film in lieu of a silicon film, and is classified into a monomer OTFT using oligothiophene, pentacene and so on, and into a polymer OTFT using polythiophene and so on, depending on the type of material of the organic film.

The OTFT is manufactured mainly using a solution process including dissolving an organic semiconductor in a solvent thus forming a thin film on a substrate. In the case where a multilayered thin film including a dielectric layer, an organic semiconductor layer and a protective layer is manufactured through the solution process, problems in which a solvent used in subsequent processes damages the under lying layers which have been already formed may occur. In order to more effectively perform the solution process, thorough research into manufacturing a multilayered thin film through a single coating process is being conducted. Also, to reduce the manufacturing cost, methods for using an expensive organic semiconductor in a small amount are in constant demand.

To this end, the combination of the electrical properties of the organic semiconductor, the mechanical properties of the insulating polymer, and the material properties of the inexpensive material is being studied. Recently, H. Sirringhaus Group, UK, has succeeded in the manufacture of a device able to maintain charge mobility even when poly-3-hexyl thiophene (P3HT) is used only in an amount of about 3 wt % upon blending of P3HT which is a kind of organic semiconductor with polystyrene (PS) or polyethylene (PE) which is an insulting polymer, and the results thereof are reported in Nature Materials, 5, 956 (2006) and disclosed in PCT patent WO 2008/001123 A1. However, in the case of this method, the device able to maintain charge mobility despite the use of a small amount of P3HT may be manufactured only under a condition in which the insulating polymer used is a crystalline polymer, for example, isotactic-PS or high-density PE. The reason is that P3HT is spread on the substrate while being crystallized, and the insulating polymer layer is then formed on the P3HT layer, thus obtaining a structure in which the P3HT layer and the insulating polymer layer are vertically phase-separated on the substrate. Accordingly, even when P3HT is used in a small amount, a charge transfer passage may be formed between source and drain electrodes. However, this method is difficult to commercialize because of a complicated manufacturing process including the crystallization of P3HT and then the solidification of the insulating polymer. Further, because a drop-casting process is employed, it makes it difficult to manufacture a device through application of a uniform film on a large area.

Using a blend of P3HT and polymethylmethacrylate (PMMA), the P3HT and PMMA are vertically phase-separated on the substrate so that PMMA is located on P3HT to thus use the PMMA layer as the protective layer of the P3HT layer, which was studied by A. Arias in Palo Alto Research Center (Adv. Mater. 19, 2900 (2006)). However, PMMA has a limitation of using it only as the protective layer, and also, P3HT should be added up to 40% and is thus unfavorable in terms of reducing use of the organic semiconductor.

In Adv. Mater, 2008, 20, 1141-1145 and PCT/KR2008/005427, in order to solve these problems, there have been proposed methods of coating the surface of a hydrophilic substrate with a blend solution of a polymer semiconductor and an insulating polymer having surface energy greater than that of the organic semiconductor to thus achieve vertical phase-separation. According thereto, the polymer semiconductor and the insulating polymer applied on the hydrophilic substrate through spin coating are configured such that the insulating polymer having relatively greater surface energy is formed on the hydrophilic substrate, and the polymer semiconductor having smaller surface energy is formed on the insulating polymer thin film. In this case, when the polymer semiconductor is used as the organic semiconductor layer and the insulating polymer is used as the dielectric layer, a high-performance OTFT may be manufactured through a single process.

However, the polymer semiconductor has low crystallinity and does not exceed field effect mobility of 0.1 $cm^2$/Vs. In the spin casting process, the blend solution is subjected to strong centrifugal force, and the difference in concentration of the solution due to evaporation of the solvent causes Marangoni instability, resulting in lateral phase-separation. Hence, it is very difficult to control the phase separation process. Further, the two-layer structure of polymer/polymer blend is considerably unstable because it may be broken. Accordingly, the demand for methods of simply and reproducibly manufacturing the multilayered thin film composed of organic semiconductor layer/insulating layer through a solution process continues.

Therefore, the present invention is intended to provide methods of manufacturing a multilayered thin film using vertical phase-separation of a blend of small molecular organic semiconductor/insulating polymer and of increasing the phase separation of the thin film of the blend through an annealing process and the crystallinity of the organic semiconductor, and fabrication of the OTFT using the same.

DISCLOSURE OF INVENTION

Technical Problem

Accordingly, the present invention provides a method of simultaneously forming an insulating polymer layer and a crystalline small molecular organic semiconductor layer on a substrate.

Also, the present invention provides a thin film composed of an insulating polymer layer and a crystalline small molecular organic semiconductor layer.

Also, the present invention provides a method of manufacturing an OTFT, including forming a thin film composed of an insulating polymer layer and a crystalline small molecular organic semiconductor layer through a solution process.

Also, the present invention provides an OTFT including an insulating polymer layer and a crystalline small molecular organic semiconductor layer.

Technical Solution

An aspect of the present invention provides a method of manufacturing a thin film, including applying a blend solution of an organic semiconductor and an insulating polymer on a substrate thus forming a phase-separated thin film, which is then annealed, thus increasing the degree of phase separation.

In the present invention, the thin film may be formed through a single coating process of the blend solution, and is a multilayered thin film including the organic semiconductor layer and the insulating polymer layer which are vertically phase-separated due to the difference in surface energy therebetween in the coating process.

In the present invention, the insulating polymer layer may be composed exclusively of a pure insulating polymer, or may be a layer composed mainly of an insulating polymer and including a part of the organic semiconductor which is not phase-separated.

In the thin film, the position of the organic semiconductor layer and the insulating polymer layer may be inverted, depending on the magnitude of the surface energy of the substrate.

In an embodiment of the present invention, in the case where a blend solution of organic semiconductor and insulating polymer having surface energy higher than that of the organic semiconductor is applied on a hydrophilic substrate having high surface energy, for example, a silicon substrate, a silicon substrate having a silicon oxide dielectric layer thermally grown thereon or a hydrophilic flexible substrate, the insulating polymer layer having high surface energy may be formed at a lower position and the organic semiconductor layer may be formed at an upper position.

In the present invention, the organic semiconductor is a semiconductor material which may be phase-separated from the insulating polymer due to the difference in surface energy, and is exemplified by various organic semiconductor materials which may be subjected to a solution process.

In an embodiment of the present invention, the organic semiconductor may include a polymeric, oligomeric or small molecular organic semiconductor. The organic semiconductor material remaining in the insulating polymer thin film is crystallized while being transferred to the organic semiconductor thin film through annealing, ultimately improving the degree of phase separation and the properties of the organic semiconductor thin film. Examples of the organic semiconductor include triethylsilylethynyl anthradithiophene (TES-ADT), triisopropylsilylethynyl pentacene (TIPS-PEN), and fluorinated triethylsilylethynyl anthradithiophene (diF-TES-ADT).

In the present invention, the insulating polymer is a polymer material which may be phase-separated from the organic semiconductor material due to the difference in surface energy, and examples thereof include various polymer materials which may be subjected to a solution process, including both crystalline and amorphous materials.

In an embodiment of the present invention, the insulating polymer having surface energy relatively higher than that of the organic semiconductor material may be used so that it is provided in the form of a thin film under the organic semiconductor thin film upon application on the hydrophilic substrate.

Examples of the insulating polymer include polymers such as polymethyl-methacrylate, polystyrene and polymethylstyrene. Particularly useful is polymethyl-methacrylate having a hydrophilic group.

In the present invention, the blend solution of organic semiconductor and insulating polymer should be formed at a weight ratio adequate for the phase separation of the organic semiconductor and the insulating polymer, and may be used in as small an amount as possible so as to reduce the amount of the organic semiconductor. In an embodiment of the present invention, the weight ratio of the insulating polymer and the organic semiconductor may be set in the range of from about 1:1 to about 99:1, and preferably at about 4:1. If the amount of the organic semiconductor is too much, the manufacturing cost is increased. In contrast, if the amount thereof is too small, electrical properties are deteriorated.

In the present invention, the blend solution may be prepared using a solvent able to simultaneously dissolve the organic semiconductor and the insulating polymer. A typical solvent for a general solution process may be used. In an embodiment of the present invention, examples of the solvent include toluene, chlorobenzene, chloroform, and dichloroethane, and the solvent may be used in an amount of about 0.1~10 wt %.

In the present invention, the annealing process under solvent vapor is performed by allowing the thin film to stand for a predetermined time period under predetermined conditions so that the organic semiconductor material of the thin film is transferred to the organic semiconductor layer. In an embodiment of the present invention, the annealing process may be performed by allowing the multilayered thin film to stand at room temperature or high temperature in a vacuum, air or solvent atmosphere so that phase separation of the multilayered thin film occurs more remarkably.

In the present invention, in the case where the annealing under the solvent vapor is performed by allowing the thin film to stand for a predetermined time period, although it is not theoretically limited, the solvent vapor infiltrates the blend thin film. In this procedure, while the organic semiconductor having surface energy smaller than that of the insulating polymer is transferred to a surface of the thin film, the phase separation is maximized. Further, the organic semiconductor material transferred to the surface is increasingly crystallized.

In an embodiment of the present invention, the solvent used for the annealing process is not particularly limited as long as the organic semiconductor and the insulating polymer may be dissolved therein. The same kind of solvent used for applying the blend solution may be used. In the embodiment of the present invention, examples of the solvent include toluene, chlorobenzene, chloroform, and dichloroethane. In this embodiment of the present invention, the time period required to allow the thin film to stand may be determined depending on the change in phase separation and the degree of crystallinity of the organic semiconductor material, and is preferably set to 5-60 min.

Another aspect of the present invention provides a method of manufacturing an OTFT, including preparing a substrate, forming a gate electrode on the substrate, applying a blend solution of an organic semiconductor and an insulating polymer having surface energy higher than that of the organic semiconductor on the substrate, thus forming a phase-separated organic insulator/semiconductor thin film, annealing the thin film, and forming drain and source electrodes connected to each other upon the organic semiconductor thin film.

In the present invention, an example of the substrate may include a hydrophilic substrate having high surface energy so that the thin film resulting from the application of the blend solution of organic semiconductor and insulating polymer is vertically phase-separated thus forming the insulating polymer layer at the lower portion of the thin film and the organic semiconductor layer at the upper portion thereof.

In an embodiment of the present invention, the hydrophilic substrate may be a hydrophilic silicon substrate or a hydrophilic flexible substrate. The hydrophilic flexible substrate may be prepared using a polymer such as polyacrylate, or alternatively may be subjected to UV/ozone treatment before being used so that pollutants are removed from the surface of the substrate and a hydrophilic group is further activated.

In the present invention, the OTFT may be manufactured using either a substrate having a dielectric layer such as silicon dioxide or a silicon substrate having no dielectric layer. In an embodiment of the present invention, in the case where the substrate has no dielectric layer, the insulating polymer layer formed at the lower portion of the phase-separated thin film may act as the dielectric layer. Alternatively, in the case where the substrate has the dielectric layer, an additional dielectric layer composed of the typical dielectric layer and the insulating polymer formed thereon may be provided on the substrate.

In the present invention, the gate electrode may be formed through a typical process. For example, in the case of the flexible substrate, the substrate may be coated with PEDOT/PSS, thus forming the electrode.

In the present invention, the phase-separated thin film is a multilayered thin film including the organic semiconductor layer and the insulating polymer layer configured such that the organic semiconductor layer is formed at the upper portion of the thin film and the insulating polymer layer having surface energy higher than that of the organic semiconductor is formed at the lower portion of the thin film.

In an embodiment of the present invention, the thin film may result from the vertical separation of the organic semiconductor and the insulating polymer on the hydrophilic substrate using the difference in surface energy therebetween, and may be formed by applying the blend solution on the substrate.

In the present invention, the thin film may be subjected to annealing in a solvent vapor atmosphere to allow it to stand for a predetermined time period, thus further increasing the degree of phase separation and also increasing the degree of crystallinity of the organic semiconductor layer at the surface of the thin film.

In the present invention, the source and drain electrodes may be formed through deposition of metal, or alternatively may be formed by ink-jet printing PEDOT/PSS on the thin film. As such, the ink-jet printing may be performed using a known device.

A further aspect of the present invention provides a transistor including a substrate having a gate electrode, a thin film formed on the substrate and composed of a lower insulating polymer layer and an upper organic semiconductor layer, and source and drain electrodes connected to each other via the organic semiconductor layer, wherein the organic semiconductor is a small molecular organic semiconductor.

In the present invention, the organic semiconductor may be the small molecular organic semiconductor such as triethylsilylethynyl anthradithiophene (TES-ADT), triisopropylsilylethynyl pentacene (TIPS-PEN), and fluorinated triethylsilylethynyl anthradithiophene (diF-TES-ADT).

In the present invention, the substrate may be either a substrate having a dielectric layer or a substrate having no dielectric layer.

In an embodiment of the present invention, in the case of the substrate having the dielectric layer, the polymer insulating layer may be formed on the dielectric layer, and the organic semiconductor layer may be formed on an additional dielectric layer composed of the dielectric layer and the insulating polymer layer sequentially formed on the substrate. Alternatively, in the case of the substrate having no dielectric layer, the polymer insulating layer may act as the dielectric layer.

The gate electrode, and the source and drain electrodes may be typical electrodes for use in the fabrication of the OTFT. For example, gold or PEDTO/PSS electrodes may be used.

Still a further aspect of the present invention provides a method of increasing the crystallinity of the organic semiconductor thin film by subjecting the organic semiconductor thin film prepared from the organic semiconductor solution to annealing in a solvent vapor atmosphere.

In the present invention, the organic semiconductor solution may be applied through a process of using the semiconductor dissolved in the solvent, for example, spin coating or ink-jet printing.

The organic semiconductor thin film is a thin film having low crystallinity formed by applying or printing the organic semiconductor solution, and the crystalline organic semiconductor thin film is a thin film formed by crystallizing the small molecular organic semiconductor.

In the present invention, the solvent vapor may include various solvents for preparing the organic semiconductor solution, for example, toluene, chlorobenzene, chloroform, and dichloroethane.

Advantageous Effects

The present invention can provide a method of simultaneously forming the lower insulating polymer layer and the upper small molecular organic semiconductor layer using phase separation through a single coating process.

Also, the present invention can provide a novel method of increasing the phase separation of the blend thin film and the crystallinity of the organic semiconductor.

Also, the present invention can provide an OTFT including the lower insulating polymer layer and the upper small molecular organic semiconductor layer which are phase-separated from each other. Even when a substrate having no dielectric layer is used, the insulating polymer layer can act as the dielectric layer, thus realizing high-performance electrical properties.

Also, in the method according to the present invention, a solution process such as spin coating or ink-jet printing can be applied, and the organic semiconductor layer and the insulating layer can be formed through a single process, thus generating economic benefits. Further, all-organic field-effect transistors (OFETs) can be formed on a flexible substrate through the solution process, thus manufacturing the OTFT having superior performance.

MODE FOR THE INVENTION

A better understanding of the present invention may be obtained through the following examples which are set forth to illustrate, but are not to be construed as limiting the present invention.

Triethylsilylethynyl anthradithiophene (TES-ADT) was prepared and thus used, and PMMA (Mw=996 kg/mol), 1,2-dichloroethane, chloroform, toluene and cyclohexane were commercially available.

An doped n-type silicon substrate (thickness 2 nm) having no thermally grown silicon dioxide was washed with a Piranha solution and then distilled water, and then stored in a vacuum oven before being used.

PMMA and TES-ADT (at a weight ratio of 4:1) were dissolved in toluene, thus preparing a 8.5 wt % blend solution. Then, the blend solution was spin cast on a substrate at 3500 rpm. Thereafter, samples were placed in a vacuum oven and allowed to stand overnight in order to remove the remaining solvent. Additionally, the blend film was subjected to annealing under solvent vapor using 1 ml of each of 1,2-dichloroethane/chloroform/toluene solvents for a time period ranging from 30 min to about 1 hour in a closed chamber, and then dried in a vacuum oven. The respective solvent vapor pressures were 6.5 kPa (1,2-dichloroethane), 22 kPa (chloroform), and 2.8 kPa (toluene).

Among these solvents, 1,2-dichloroethane was representatively used in the thin film analysis. In order to selectively dissolve the TES-ADT layer, the blend film was etched with cyclohexane, and then washed with distilled water.

To measure the dielectric properties of the lower PMMA layer containing TES-ADT, an Au electrode for an Si-PMMA-Au capacitor having a contact area of 0.005 cm$^2$ was formed on the PMMA layer through a shadow mask. Then, source-drain electrodes of the OTFT were formed using gold through a shadow mask. The channel was 50 μm long and 800 μm wide.

Fabrication of Flexible OFET

A polyarylate (PAR, available from Ferrania Technology) film was used as a flexible polymer substrate, and washed using a UV/ozone washer before being used. PEDOT/PSS droplets were spin cast on the PAR film, thus forming a gate electrode. The blend film was formed through the same process as above, and 1,2-dichloroethane was used as a solvent vapor annealing solvent. Then, source-drain electrodes were formed using ink-jet printed PEDOT/PSS droplets.

Figure 1:
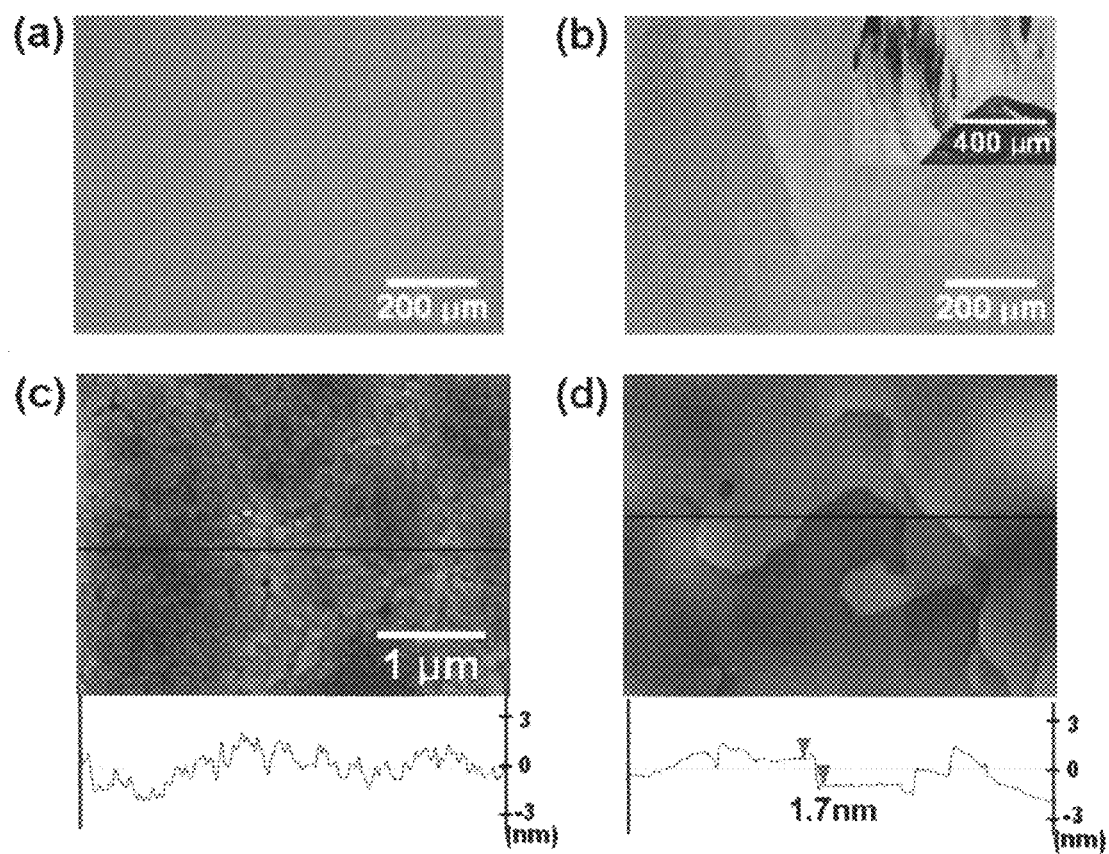
FIGS. 1A and 1C show respectively an optical microscope image and an atomic force microscope (AFM) image of a TES-ADT/PMMA film shortly after a spin casting process.
FIGS. 1B and 1D show respectively an optical microscope image and an AFM image of the TES-ADT/PMMA film after a solvent vapor annealing process, the view included in FIG. 1B showing a polarized optical microscope image.

As shown in the optical microscope image (FIG. 1A) and the AFM image (FIG. 1C) of the spin cast TES-ADT/PMMA blend thin film, there was no specific shape, and the water contact angle (101±1°) of the blend film was the same as that of the TES-ADT film, and thus TES-ADT (γ: 35.8 mJm$^{-2}$) having surface energy smaller than that of PMMA (γ: 45.8 mJm$^{-2}$) was assumed to be formed at a surface of the thin film. When the blend thin film was subjected to annealing under solvent vapor, TES-ADT began to be crystallized from the surface. After about 30 min, TES-ADT was largely crystallized to the extent of covering the entire surface. In FIG. 1C, the crystalline TES-ADT was observed after the solvent vapor annealing, and in the AFM image of FIG. 1D, the TES-ADT terrace structure having a step and a corner was seen. The height of the TES-ADT step had a size corresponding to the size of the c-axis unit cell (16.7 angstroms) of the TES-ADT molecule.

Figure 2:
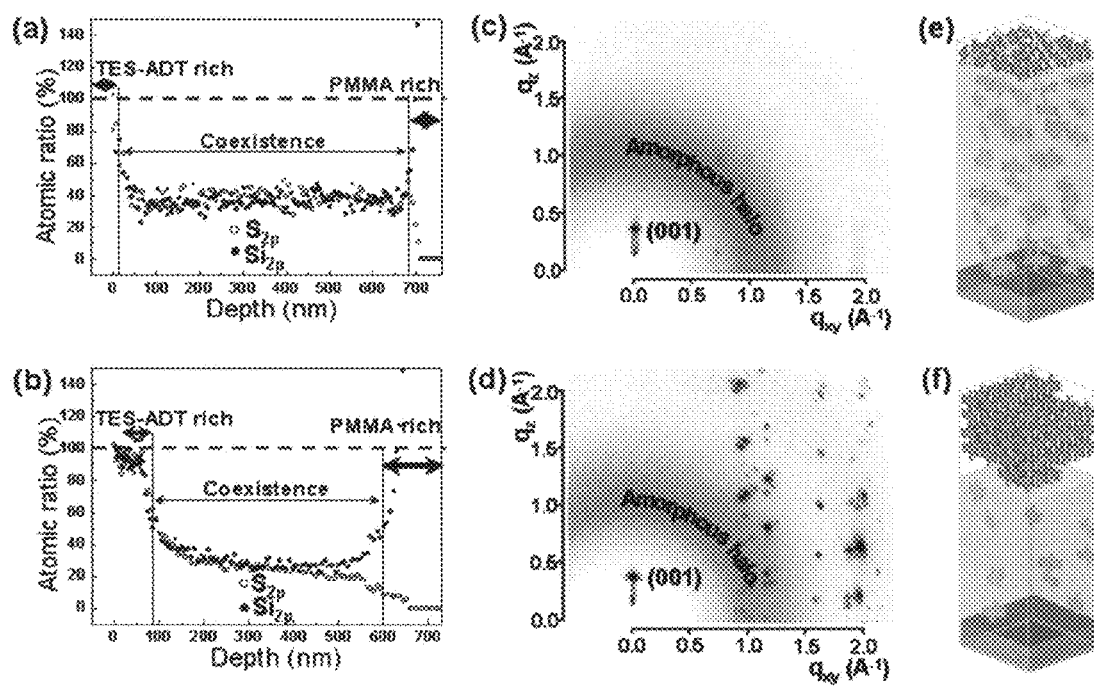
FIGS. 2A and 2B show an atomic ratio of sulfur and silicon in the TES-ADT/PMMA film depending on the depth shortly after a spin casting process and after a solvent vapor annealing process respectively (closed circle: $Si_{2p}$, open circle: $S_{2p}$, in respective cases, the composition of sulfur and silicon in the homo-TES-ADT film was calculated to 100%)
FIG. 2C shows an X-ray diffractive pattern of the TES-ADT/PMMA film shortly after a spin casting process.
FIG. 2D shows an X-ray diffractive pattern of the TES-ADT/PMMA film after a solvent vapor annealing process.
FIG. 2E shows a schematic molecular packing structure of the TES-ADT/PMMA film shortly after a spin casting process.
FIG. 2F shows a schematic molecular packing structure of the TES-ADT/PMMA film after a solvent vapor annealing process.

FIGS. 2A and 2B show the results of measurements of XPS of the composition of the TES-ADT/PMMA film depending on the depth while cutting the surface of the film through sputtering. FIGS. 2A and 2B show the relative atomic ratio of sulfur and silicon in the TES-ADT/PMMA film depending on the depth shortly after spin casting and after the solvent vapor annealing, respectively. The film is divided into three regions depending on the depth, including 1) the upper TES-ADT region, 2) the coexisting region having small TES-ADT and large PMMA, and 3) the lower PMMA region. After the solvent vapor annealing, TES-ADT was transferred to the surface to thus reduce the size of the coexisting region. Almost 100% TES-ADT was shown to the depth of about 70 nm from the surface. The TES-ADT layer was etched with cyclohexane and thus the thickness thereof was 10~20 nm and then increased to 70~80 nm after the solvent vapor annealing. Also, FIGS. 2C and 2D show the XRD diffractive pattern of the blend thin film. As is apparent from these drawings, it could be seen that in-plane pattern was greatly increased after the solvent vapor annealing, thus increasing the crystallinity of the thin film. The changes in structure of the thin film before and after the solvent vapor annealing are shown in FIGS. 2E and 2F.

Figure 3:
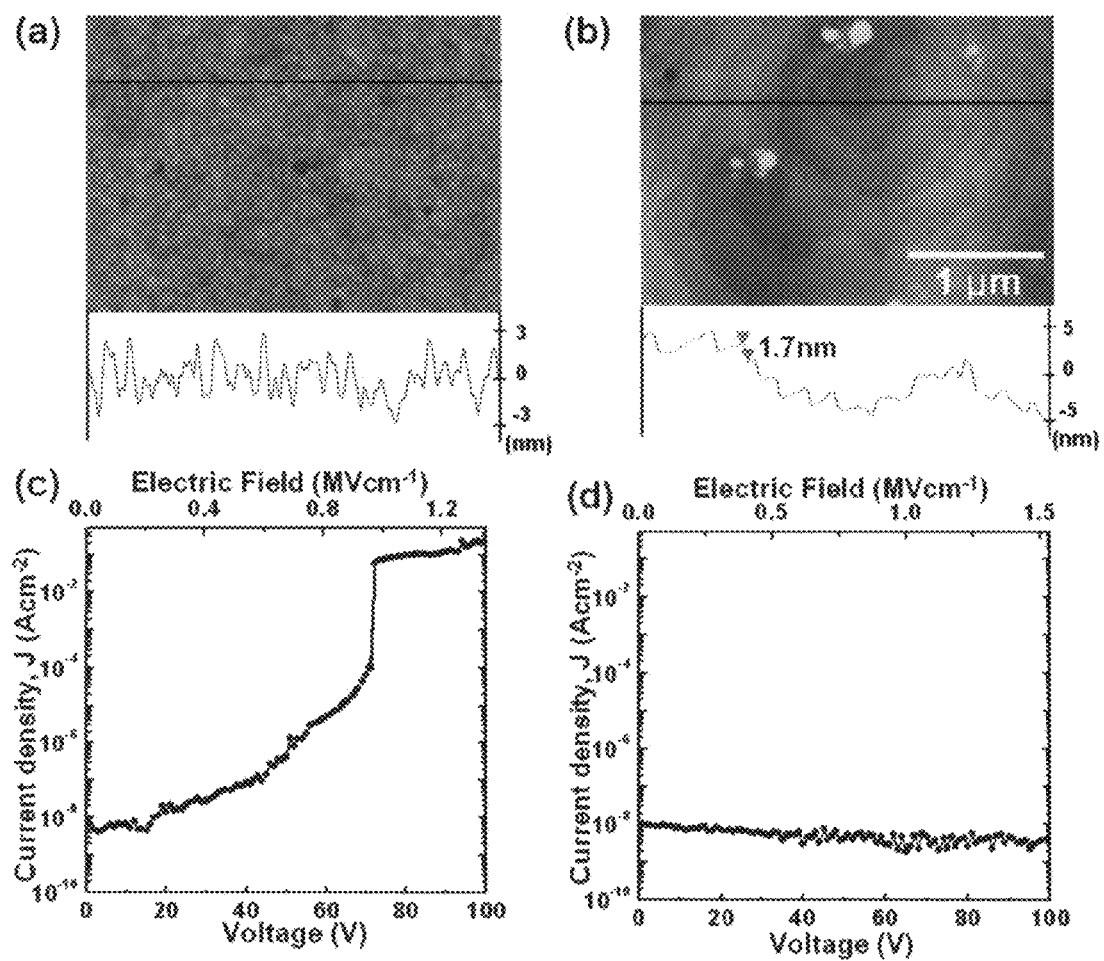
FIGS. 3A and 3C show respectively an AFM image and a curve of leakage current density versus voltage or electric field of the cyclohexane-etched TES-ADT/PMMA film shortly after a spin casting process.
FIGS. 3B and 3D show, respectively, an AFM image and a curve of leakage current density versus voltage or electric field of the cyclohexane-etched TES-ADT/PMMA film after a solvent vapor annealing process.
Figure 4:
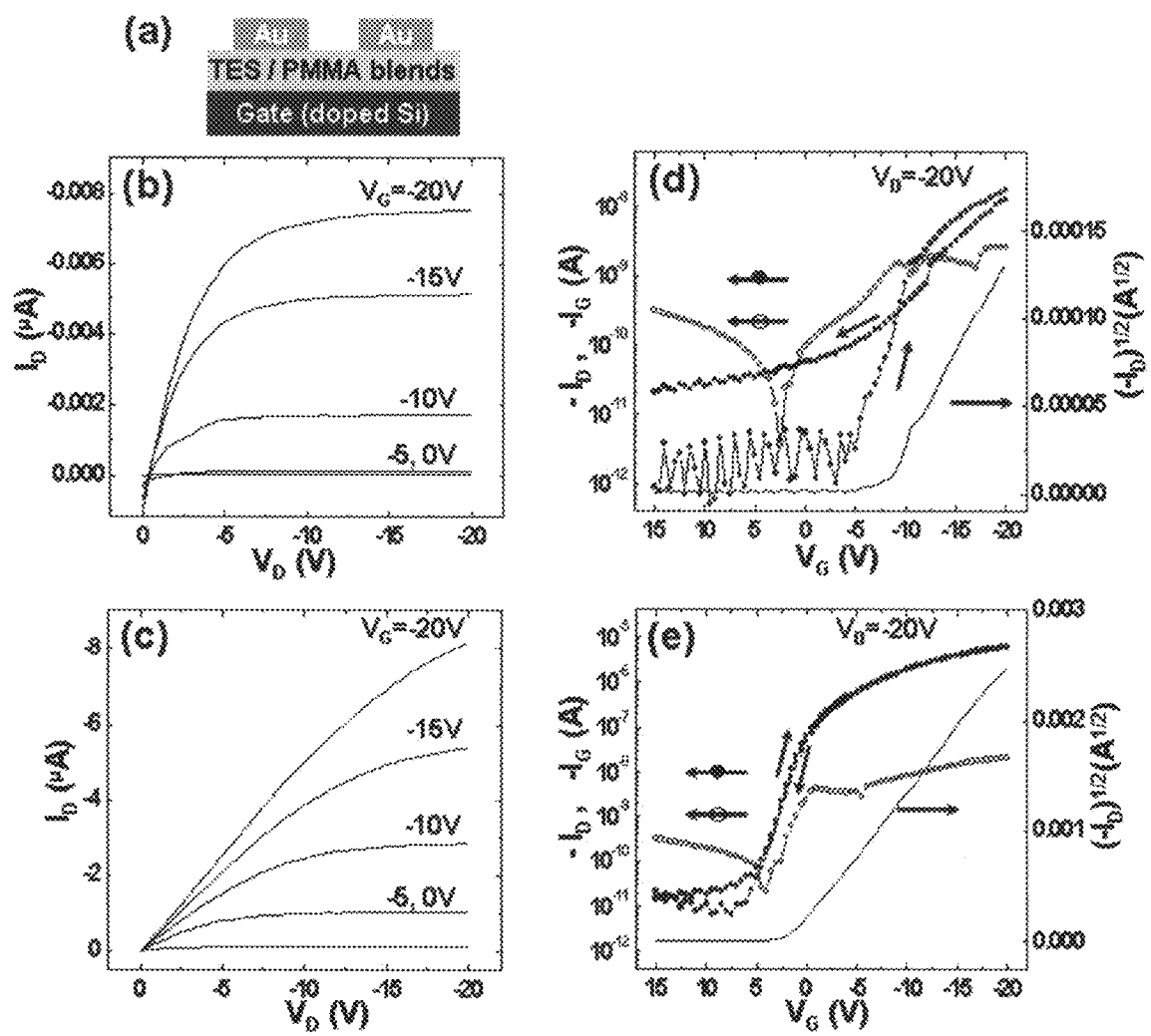
FIG. 4A shows a cross-sectional view of a TES-ADT/PMMA FET on a silicon substrate.
FIGS. 4B and 4D show, respectively, output properties and transfer properties of the TES-ADT/PMMA FET shortly after a spin casting process.
FIGS. 4C and 4E show, respectively, output properties and transfer properties of the TES-ADT/PMMA FET after a solvent vapor annealing process.

The TES-ADT layer was etched with cyclohexane, and the surface morphology was observed using a microscope. The results are shown in FIGS. 3A and 3B. Before and after the annealing, the insulating properties of the dielectric layer are shown in FIGS. 3C and 3D. After the casting, dielectric breakdown occurred at about 70 V due to the small amount of TES-ADT dispersed in the PMMA layer. After the solvent vapor annealing, the TES-ADT dispersed in the PMMA layer was transferred and thus dielectric breakdown did not occur to about 100V. The dielectric layer obtained through the phase separation of the TES-ADT/PMMA blend could be seen to exhibit sufficient dielectric properties.

The device properties of the OTFT using the TES-ADT/PMMA blend on the silicon substrate are shown in FIGS. 4A to 4E. Before the solvent vapor annealing, low field effect mobility ($7\pm2\times10^{-3}$ cm$^2$/Vs) was shown (FIG. 4D), whereas the field effect mobility was increased to $0.47\pm0.09$ cm$^2$/Vs (FIG. 4E) after 1,2-dichloroethane vapor annealing. From this, it could be seen that TES-ADT of the surface layer acted as a good charge transfer passage, and the lower PMMA acted as an insulating layer, resulting in high-performance OTFT.

Figure 5:
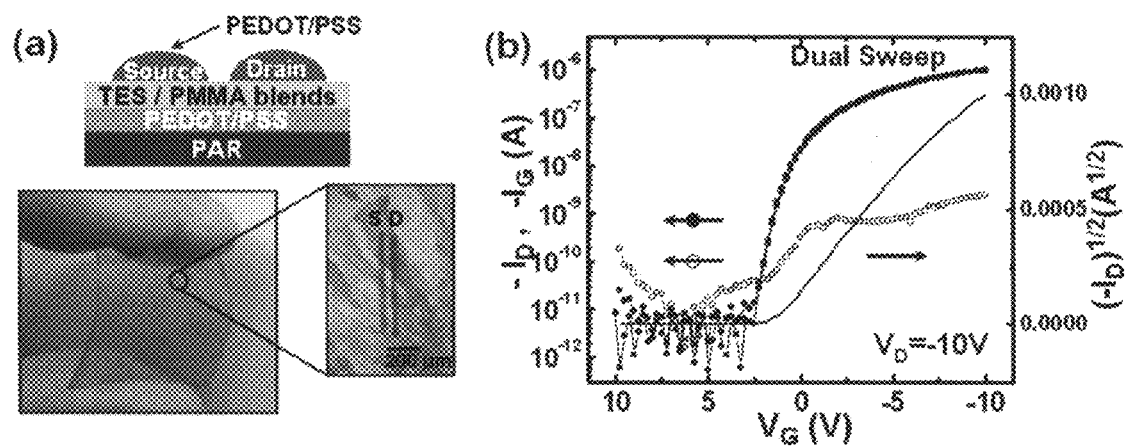
FIG. 5A shows a cross-sectional view, a digital camera image and an optical microscope image of the TES-ADT/PMMA FET on a flexible substrate.
FIG. 5B shows transfer properties of the TES-ADT/PMMA FET on the flexible substrate.

The flexible OFET manufactured using the TES-ADT/PMMA blend is illustrated in FIG. 5A. As shown in the transfer properties of FIG. 5B, the saturated drain current (~1 µA) was much greater than the gate leakage current (~2 nA), and high charge mobility of 0.4 cm$^2$/Vs was obtained.

The invention claimed is:

1. A method of manufacturing a thin film, comprising applying a blend solution of an organic semiconductor and an insulating polymer thus forming a thin film comprising three regions depending on the depth: (1) an upper organic semiconductor region, (2) a coexisting region of the organic semiconductor and the insulating polymer, and (3) a lower insulating polymer region, and then annealing the thin film by exposing the thin film to a solvent atmosphere for a predetermined time to reduce the size of the coexisting region by transferring the organic semiconductor to the upper organic semiconductor region.

2. The method according to claim 1, wherein the insulating polymer has surface energy higher than that of the organic semiconductor.

3. The method according to claim 1, wherein the thin film is formed on a hydrophilic substrate.

4. The method according to claim 3, wherein the hydrophilic substrate is a silicon substrate or a hydrophilic flexible substrate.

5. The method according to claim 1, wherein the organic semiconductor is a small molecular organic semiconductor.

6. The method according to claim 5, wherein the organic semiconductor is triethylsilylethynyl anthradithiophene (TES-ADT), triisopropylsilylethynyl pentacene (TIPS-PEN), or fluorinated triethylsilylethynyl anthradithiophene (diF-TES-ADT).

7. The method according to claim 1, wherein a weight ratio of the insulating polymer and the organic semiconductor is 1:1~99:1.

8. The method according to claim 1, wherein the organic semiconductor layer is crystallized through annealing.

9. The method according to claim 1, wherein the annealing is performed using a solvent able to dissolve the organic semiconductor and the insulating polymer.

10. The method according to claim 9, wherein the solvent is selected from among toluene, chlorobenzene, chloroform, dichloroethane, and mixtures of two or more thereof.

11. The method according to claim 1, wherein the annealing is performed for a time period of 5~60 min.

12. A method of manufacturing an organic thin film transistor, comprising:
preparing a substrate;
forming a gate electrode on the substrate;
forming a thin film on the substrate comprising three regions depending on the depth: (1) an upper organic semiconductor region, (2) a coexisting region of the semiconductor and the insulating polymer, and (3) a lower insulating polymer region, using a blend solution of an organic semiconductor and an insulating polymer, in which the insulating polymer has surface energy higher than that of the organic semiconductor;
annealing the thin film by exposing the thin film to a solvent atmosphere for a predetermined time to reduce the size of the coexisting region by transferring the organic semiconductor to the upper organic semiconductor region; and
forming drain and source electrodes connected to each other via the organic semiconductor layer.

13. The method according to claim 12, wherein the substrate is a silicon substrate or a hydrophilic polymer substrate.

14. The method according to claim 13, wherein the substrate is a UV/ozone treated substrate.

15. The method according to claim 12, wherein the substrate is a hydrophilic substrate with or without a dielectric layer.

16. The method according to claim 12, wherein the thin film is a thin film comprising the organic semiconductor layer and the insulating polymer layer formed under the organic semiconductor layer.

17. The method according to claim 12, wherein the thin film is formed through spin coating.

18. The method according to claim 12, wherein the organic semiconductor is a small molecular organic semiconductor.

19. The method according to claim 12, wherein the organic semiconductor is crystallized through annealing.

20. The method according to claim 12, further comprising forming a dielectric layer on the substrate.

* * * * *